US010447177B2

(12) United States Patent
Karami et al.

(10) Patent No.: US 10,447,177 B2
(45) Date of Patent: Oct. 15, 2019

(54) ENERGY HARVESTING FROM CONSTRAINED BUCKLING OF PIEZOELECTRIC BEAMS

(71) Applicants: THE REGENTS OF THE UNIVERSITY OF MICHIGAN, Ann Arbor, MI (US); The Research Foundation for the State University of New York, Amherst, NY (US)

(72) Inventors: Mohammad Amin Karami, Buffalo, NY (US); Daniel J. Inman, Saline, MI (US); Mohammad Hossein Ansari, Amherst, NY (US)

(73) Assignees: THE REGENTS OF THE UNIVERSITY OF MICHIGAN, Ann Arbor, MI (US); The Research Foundation for the State University of New York, Amherst, NY (US)

( * ) Notice: Subject to any disclaimer, the term of this patent is extended or adjusted under 35 U.S.C. 154(b) by 311 days.

(21) Appl. No.: 15/234,059

(22) Filed: Aug. 11, 2016

(65) Prior Publication Data
US 2017/0047865 A1 Feb. 16, 2017

Related U.S. Application Data

(60) Provisional application No. 62/204,695, filed on Aug. 13, 2015.

(51) Int. Cl.
*H01L 41/113* (2006.01)
*H02N 2/18* (2006.01)

(52) U.S. Cl.
CPC ........... *H02N 2/18* (2013.01); *H01L 41/1134* (2013.01)

(58) Field of Classification Search
CPC ............... H01L 41/113; H01L 41/1132; H01L 41/1134; H01L 41/1136; H01L 41/1138
(Continued)

(56) References Cited

U.S. PATENT DOCUMENTS

2005/0134149 A1   6/2005  Deng et al.
2007/0114890 A1*  5/2007  Churchill ............ H01L 41/1136
                                                   310/339
(Continued)

FOREIGN PATENT DOCUMENTS

CN        204011202 U    12/2014
CN        104300833 A     1/2015
(Continued)

OTHER PUBLICATIONS

International Search Report and Written Opinion of the International Searching Authority dated Nov. 11, 2016 regarding PCT/US2016/046807.
(Continued)

*Primary Examiner* — Derek J Rosenau
(74) *Attorney, Agent, or Firm* — Harness, Dickey & Pierce, P.L.C.

(57) ABSTRACT

An energy harvesting system for harvesting energy in response to application of an external force. The energy harvesting system comprises a beam member having a central member and at least one piezoelectric layer joined to the central member for deflection therewith. The beam member includes opposing first and second ends and is elastically deformable in response to application of the external force. A first mount couples the first end of the beam member and is generally stationary. A second mount couples the second end of the beam member. The second mount and the second end of the beam member are generally moveable in response to application of the external force between a (Continued)

first position and a second position, thereby outputting energy from the at least one piezoelectric layer in response to the movement from the first position to the second position.

9 Claims, 11 Drawing Sheets

(58) Field of Classification Search
USPC .......................................................... 310/339
See application file for complete search history.

(56) References Cited

U.S. PATENT DOCUMENTS

| | | | |
|---|---|---|---|
| 2007/0145861 A1* | 6/2007 | Tanner | A45F 3/08 310/339 |
| 2008/0100180 A1 | 5/2008 | Clingman et al. | |
| 2011/0101827 A1 | 5/2011 | Yoon et al. | |
| 2012/0086310 A1 | 4/2012 | Allaei | |
| 2014/0070670 A1 | 3/2014 | Burgueno et al. | |
| 2016/0294307 A1* | 10/2016 | Klump | H01L 41/1134 |

FOREIGN PATENT DOCUMENTS

| | | |
|---|---|---|
| CN | 104798217 A | 7/2015 |
| WO | 2014076458 A1 | 5/2014 |
| WO | 2015/039103 A1 | 3/2015 |

OTHER PUBLICATIONS

Anton, Steven R. et al. "A Review of Power Harvesting Using Piezoelectric Materials (2003-2006)". Smart Materials and Structures 16.3 (2007): R1-R21.
Daqaq, Mohammed F. et al. "Investigation of Power Harvesting via Parametric Excitations". Journal of Intelligent Material Systems and Structures 20.5 (2008): 545-557.
Cook-Chennault, K A, et al. "Powering MEMS Portable Devices—A Review of Non-Regenerative and Regenerative Power Supply Systems With Special Emphasis on Piezoelectric Energy Harvesting Systems". Smart Materials and Structures 17.4 (2008): 043001.
Beeby, S P, et al. "Energy Harvesting Vibration Sources for Microsystems Applications" Measurement Science and Technology 17 (2006): R175-R195.
Roundy, S et al. "A Piezoelectric Vibration Based Generator for Wireless Electronics" Smart Materials and Structures 13.5 (2004): 1131-1142.
Peigney, Michael, et al."Piezoelectric Energy Harvesting from Traffic-Induced Bridge Vibrations" Smart Materials and Structures, IOP Publishing, 2013, 22, pp. 095019.
Zuo, Lei et al. "Large-Scale Vibration Energy Harvesting" Journal of Intelligent Material Systems and Structures 24(11) (2013), pp. 1405-1430.
Karami, M. Amin et al. "Equivalent Damping and Frequency Change for Linear and Nonlinear Hybrid Vibrational Energy Harvesting Systems" Journal of Sound and Vibration 330 (2011), pp. 5583-5597.
Arnold, David P. "Review of Microscale Magnetic Power Generation" IEEE Transactions on Magnetics, vol. 43, No. 11 (Nov. 2007), pp. 3940-3951.
Quinn, D. Dane, et al. "Comparing Linear and Essentially Nonlinear Vibration-Based Energy Harvesting" Journal of Vibration and Acoustics, vol. 133 (Feb. 2011).
Stanton, Samuel C., et al. "Nonlinear Dynamics for Broadband Energy Harvesting: Investigation of a Bistable Piezoelectric Inertial Generator" Physica D, vol. 239 (2010) pp. 640-653.
Daqaq, Mohammed F., "Response of Uni-Modal Duffing-Type Harvesters to Random Excitations" Proceedings of IMAC-XXVIII, Feb. 2010.
Cottone, F., et al. "Nonlinear Energy Harvesting" Physical Review Letters, 102 (Feb. 2009).
Ghobadi, Mostafa, et al. "Foot-Mounted Inertial Measurement Unit for Activity Classification" IEEE (2014) pp. 6294-6297.
Erturk, A. et al. "An Experimentally Validated Bimorph Cantilever Model for Piezoelectric Energy Harvesting From Base Excitations", Smart Materials and Structures 18 (2009).
Erturk, A., et al. "A Distributed Parameter Electromechanical Model for Cantilevered Piezoelectric Energy Harvesters". Journal of Vibration and Acoustics, vol. 130 (Aug. 2008).
Karami, M. Amin, et al. "Analytical Modeling and Experimental Verification of the Vibrations of the Zigzag Microstructure for Energy Harvesting" Journal of Vibration and Acoustics, vol. 133 (Feb. 2011).
Friswell, Michael I., et al. "Sensor Design for Piezoelectric Cantilever Beam Energy Harvester" 10th International Conference, Jul. 12-14, 2010, Southampton.
Erturk, A. et al. "Effect of Strain Nodes and Electrode Configuration on Piezoelectric Energy Harvesting from Cantilevered Beams" Journal of Vibration and Acoustics, vol. 131 (2009).
A.M., Arjun, et al. "A Novel Approach to Recycle Energy Using Piezoelectric Crystals" International Journal of Environmental Science and Development, vol. 2, No. 6, Dec. 2011, pp. 488-492.
Niri, E. Dehghan, et al. "A Passively Tunable Mechanism for a Dual Bimorph Energy Harvester with Variable Tip Stiffness and Axial Load" Smart Materials and Structures 21 (2012).
Dagdeviren, Canan, et al. "Conformal Piezoelectric Energy Harvesting and Storage from Motions of the Heart, Lung, and Diaphragm." Proceedings of the National Academy of Sciences, vol. 111, No. 5 (Feb. 2014), pp. 1927-1932.
Erturk, A., et al. "A Piezomagnetoelastic Structure for Broadband Vibration Energy Harvesting" Applied Physics Letters, Applied Physics Letters 94 (2009): 254102.
Schwartz, Laurent, "Théorie Des Distributions à Valeurs Vectorielles. I." Annales De L'institut Fourier 7 (1957): 1-141.
European Search Report of the European Patent Office issued in 16835986.7 dated Feb. 25, 2019.

* cited by examiner

ENERGY HARVESTING FROM CONSTRAINED BUCKLING OF PIEZOELECTRIC BEAMS

CROSS-REFERENCE TO RELATED APPLICATIONS

This application claims the benefit of U.S. Provisional Application No. 62/204,695, filed on Aug. 13, 2015. The entire disclosure of the above application is incorporated herein by reference.

FIELD

The present disclosure relates to energy harvesting from constrained buckling of piezoelectric beams.

BACKGROUND AND SUMMARY

This section provides background information related to the present disclosure which is not necessarily prior art. This section provides a general summary of the disclosure, and is not a comprehensive disclosure of its full scope or all of its features.

According to the present teachings, a piezoelectric vibration energy harvester, having a piezoelectric beam, is provided to generate electricity under the weight of passing cars or crowds. The piezoelectric beam buckles to a controlled extent when the device is stepped on or otherwise depressed. The energy harvester can have horizontal or vertical configuration. Horizontal configuration is easier to install and can be tuned to low passing loads. The moving element of the device is one or more piezoelectric beams, such as a uniform bimorph beam or a segmented beam. The ends of the segmented beam are simple spring steel or brass while the central span is a piezoelectric bimorph.

The piezoelectric beam is horizontal in the horizontal configuration. In this configuration, the vertical vehicle load is transferred to a horizontal buckling force through a scissors-like mechanism. The mechanism consists of seven rigid links. In the vertical configuration, the piezoelectric beam is vertical and directly sustains the vehicle load. The vertical (direct) configuration is designed to buckle under the load of the vehicle. This results in significant deformation of the piezoelectric and generates substantial amounts of power. If the beam's buckling is not controlled, it will result in the fracture of the beam. The buckling deformation of the beam is constrained by limiting its axial deformation.

To better control the axial deformation of the buckled beam, the deformation has to be noticeable. This requires the length of the beam to be long. As the length of the beam increases its axial deformation becomes more significant. To reduce the cost of the present energy harvester, a segmented beam is preferred over a uniform beam for the buckling component. This choice allows having large axial deformation without more usage of costly piezoelectric.

In the present disclosure, the energy harvester is analytically modeled. The electro-mechanical coupling and the geometric nonlinearities have been included in the model for the piezoelectric beam. The design criteria for the device are discussed. It is demonstrated that the device can be realized with commonly used piezoelectric patches and can generate hundreds of milliwatts of power. The effect of the design parameters on the generated power and required tolerances are illustrated.

The present device could be implemented in the sidewalks producing energy from the weight of people passing over it. Other possible applications are portable smart phones chargers and shoe heel energy harvesting. The dance floor of a club is another applicable example for using this harvester. The vertical device could be implemented in roads, using the weight of the passing cars for generating electricity. The device is not prone to resonance and generates notable amounts of power from passing of each tire. It therefore can be used as a self-sufficient sensor for traffic control.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
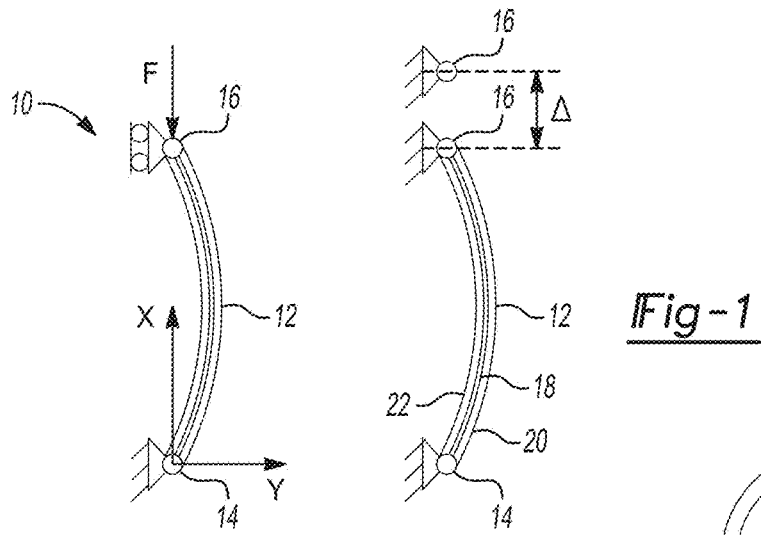
FIG. 1 is a schematic diagram of the buckled beam for a uniform beam.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

INTRODUCTION

In recent years, energy harvesting devices have attracted much interest in industrial and manufacturing sectors. The unique ability of converting ambient energy into electrical energy has led to several academic and commercial groups analyze and develop energy harvesting technology. Commonly, the generated electricity is stored in capacitors or batteries. R. Anton et al. have done a review in the field of energy harvesting and its current position for creating self-powered devices. Vibration is one of the common sources in energy harvesting. David P. Arnold has studied compact magnetic power generators using different sources of energy, including vibration. Also, Zhongjie Li modeled and analyzed electromagnetic energy harvesters for applications in vibration energy harvesters. Another commonly used method of converting vibration into the electricity is by using the piezoelectric materials.

Using vibration and piezoelectric effect has been investigated by numerous groups. The piezoelectric effect converts mechanical strain into electric current or voltage. A piezoelectric material generates a small voltage whenever it is mechanically deformed. In Cook-Chennault and his team's attempt, energy harvesting from piezoelectric materials is studied. Piezoelectric harvesters are enabling a variety of applications: portable chargers, power sources for battlefield equipment, self-winding wristwatches, etc. Beeby and his team studied the energy harvesting of the wireless self-powered microsystems, including piezoelectric materials. In research done by Roundy and Wright a vibration based piezoelectric generator for wireless sensors is studied. In their article, the design of piezoelectric vibration to electricity converter is investigated and the purpose of their device is to be used as power source for wireless electronics.

Piezoelectric beams make harvesting energy from vibrating structures possible. One vibration source for energy harvesting is the vibrations of a bridge caused by the passing cars. In this method, the energy originates from the passing vehicle, translates to the bridge and causes vibrations in the bridge. This vibration is converted into electrical energy by a piezoelectric energy harvester device. When the energy translates from the vehicle to the bridge, the energy distributes over a very large structure. The energy absorbed by the vibrational energy harvester is therefore a very small fraction of the energy wasted by the vehicle. This is the first shortcoming of the traditional approach in bridge vibrational energy harvesting. The second disadvantage of conventional devices is that they will be useful only when installed on bridges. The vibrations of the regular portions of the roads are not sufficiently large to result in notable electrical energy. The third drawback of the vibrational energy harvesters is their limited frequency bandwidth. This issue, which has received significant attention in recent years, is still being discussed.

To avoid this phenomenon, we can directly use the force of the passing cars or crowds to generate electricity. According to some embodiments of the present teachings, the harvesting of energy from vibration of passing cars over piezoelectric patch for a uniform beam is provided.

Figure 2:
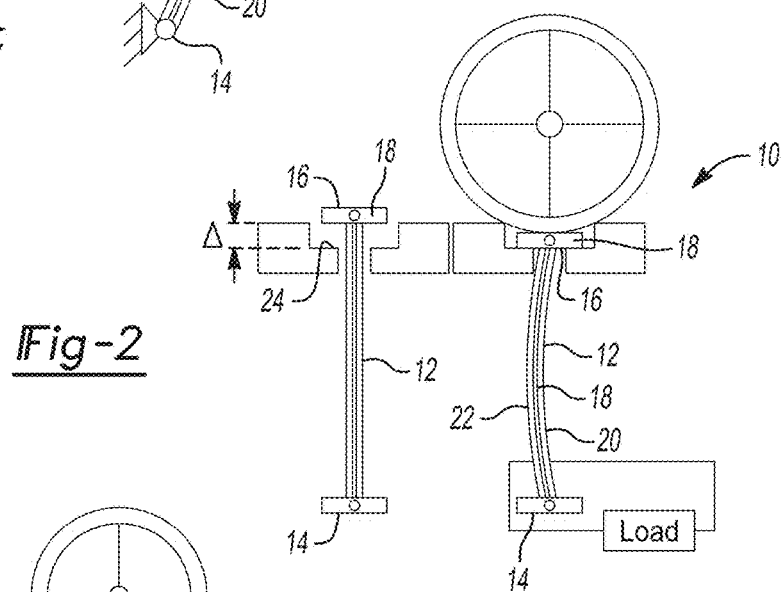
FIG. 2 illustrates the vertical configuration of the energy harvesting device for a uniform beam.
Figure 3:
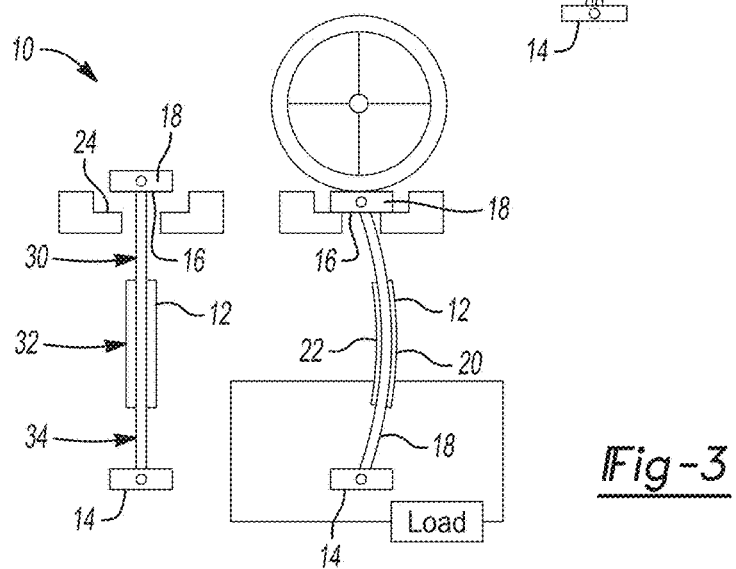
FIG. 3 illustrates the vertical configuration of the energy harvesting device for a segmented beam.

According to the present principles, a vertical configuration and a horizontal configuration are disclosed. In some embodiments, as illustrated in FIGS. 1-3, a vertically placed piezoelectric beam is used to directly generate electricity using load of the passing vehicles over roads. Generally, piezoelectric ceramics are brittle and easily crack when subjected to concentrated stress. To avoid low cycle fatigue, the piezoelectric patches are bounded to stiff materials such as metals or carbon fiber composites. Although this approach prevents cracking of the patches, it reduces the power generation. In the present device, the amount of the buckling of the beam is limited and controlled, so low cycle fatigue will not be an issue in the present device.

The present device is scalable and can be designed to fit in a shoe heel. This will make it possible to generate electricity with each step of a person. The power can be used for charging smart phones, players, or motion sensors. The sensors could operate without battery and their size will be reduced. In some embodiments, the harvester can be used as a suspension mechanism in a bicycle and using the vibration of the bicycle for generating electricity.

In the present disclosure, first the two design configurations (the vertical configuration and horizontal configuration) are explained. Both horizontal and vertical configurations are modeled and an electromechanical model for vibration and energy harvesting characteristics of the device is presented. The models are numerically solved to predict the performance of the device. At the end, the effect of the length and thickness of the active layer on the generated power is also discussed.

Device Configuration

First, we study the vertical configuration of an energy harvester device 10 which is a more trivial case. Energy harvester device 10 can comprise a vertical beam 12 mounted between a first anchor point 14 and a second anchor point 16. The first anchor point 14 can be configured to be stationary (e.g. ground) or can be configured to be movable in a direction to cause deflection of vertical beam 12. The second anchor point 16 can be coupled to a moveable member 18, such as a plate formed to be driven upon, which results in vertical deflection of the second anchor point 16 and corresponding bending movement or deflection of vertical beam 12. In some embodiments, vertical beam 12 can comprise a centrally disposed steel or brass layer 18 having two piezoelectric layers 20, 22 mounted thereto for movement therewith. However, it should be understood that only one piezoelectric layer 20 can be used. The bending movement or deflection of vertical beam 12, specifically steel or brass layer 18 and piezoelectric layers 20, 22, results in generation of electricity as a result of the deformation of piezoelectric layers 20, 22. The vertical configuration of the device (FIG. 1) is particularly suitable for installation on road surfaces. However, it can be used in any application where a vertical impulse is present.

As illustrated in FIG. 2, the present device 10 is installed on the surface of the roads such that the vehicles directly pass over it. Therefore, the transduction element that converts mechanical vibrations to electrical energy is the vertical piezoelectric bimorph 12 (18, 20, 22). Two key objectives are sought in this design. The first objective is to have a robust energy harvesting device, i.e. to generate energy from every passing tire. The second objective is to maximize the amount of energy and to induce maximum amount of stress in the piezoelectric layer 20, 22. The third goal is to have a durable device. Therefore, it is desirable to limit the maximum stress in the piezoelectric layer 20, 22 to the allowable stress level for high cycle fatigue. By implementing a stop member 24, we make sure that the amount of buckling is controlled and the piezoelectric beam will not break due to excessive stress.

FIG. 3 shows the segmented beam in the vertical configuration. The axial deformation of the piezoelectric beam should be in the millimeters range to result in a feasible $\Delta$ gap. This axial deformation significantly increases with the length of the beam. An axial deformation in millimeters range requires the length of the beam to be on the order of tens of centimeters. To increase the length of the beam without significantly increase its cost, we need to cover only part of the beam with piezoceramics. The parts that are covered with piezoceramics are the parts of the beam that are under maximum bending stress. For a pin-pin beam this part will be the middle section of the beam. As it is shown on FIG. 3 this beams consists of three different parts or sections 30, 32, 34. The first 30 and third 34 part of the beam is just a simple spring steel layer and the middle part 32 is a bimorph piezoelectric beam, with two active layers 20, 22 on the surfaces and one spring steel or brass layer 18 in between. The piezoelectric layer generates power when it buckles and also when the force is removed. When the force is removed, the beam tends to get back to its non-deformed position.

Figure 4A:
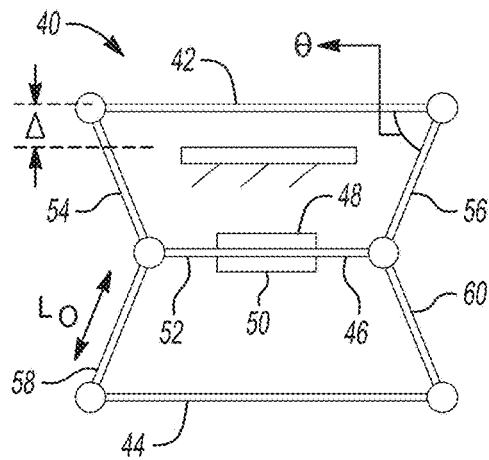
FIG. 4A illustrates the horizontal energy harvesting device before buckling.
Figure 4B:
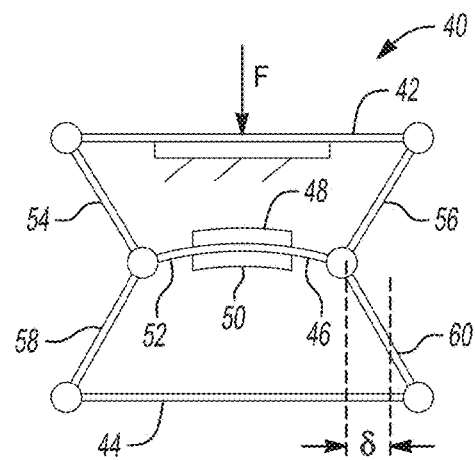
FIG. 4B illustrates the horizontal energy harvesting device after buckling.

In some embodiment, a horizontal configuration of the energy harvester device 40 is provided. As illustrated in FIGS. 4A and 4B, energy harvester device 40 can comprise seven beams connected to each other by pivot joints. More particularly, an upper and lower horizontal beam 42, 44 is provided in parallel arrangement. In some embodiments, upper and lower horizontal beams 42, 44 are made of steel. However, it should be understood that upper and lower horizontal beams 42, 44 can be made of any desired material sufficient to transmit the application of forces. Moreover, upper and lower horizontal beams 42, 44 can be incorporated and made integrally with the surround structure, such as the street, roadway, sidewalk, shoe sole, and other structure. A middle beam 46 is disposed between upper and lower horizontal beams 42, 44 and can be made of one or more piezoelectric beams, such as segmented bimorph piezoelectric beams. In some embodiments, middle beam 46, with two active piezoelectric layers 48, 50 on the surfaces of the middle beam 46 and one spring steel or brass layer 52 disposed therebetween. It should again be understood that in some embodiments, a single piezoelectric layer 48 can be used. Harvester device 40 further comprises opposing oblique beams 54, 56, 58, 60 interconnecting ends of upper horizontal beam 42 with ends of middle beam 46 and, likewise, interconnecting ends of lower horizontal beam 44 with ends of middle beam 46. Oblique beams 54, 56, 58, 60 can be inclined such that they are directed inwardly and result in a compressive load being exerted on middle beam 46 in response to a force F being applied vertically. The first objective of this device is to convert the mechanical force into electricity.

Writing the static governing equation:

$$P = F \cot(\theta)$$

$$\Delta = \delta \cot(\theta) \tag{1}$$

Where F is the force on top of the device, P is the force on two ends of the active beam, and θ is the angle between the top beam and the oblique beams ($L_o$). Δ is the gap distance and δ is the shortening in the segmented beam 46 after the beam 46 buckles. As it is seen in Eq. (1) if the angle is less than 45 degrees, P will be larger than F. It means that the mechanism magnifies the vertical force. In this case, the horizontal configuration results in a large force on the active beam with just a very small force over the harvester (F). This feature makes this harvester ideal for portable devices and for applications in which there is no access to large forces. The special design of the harvester 40 makes its placement easy in sidewalks or under a treadmill where the force over the device is not large. Another advantage of having the angle less than 45 degrees is the increase in the gap distance (Δ). As Eq. (1) shows, with the same amount of δ as the angle decreases the gap distance increases, which makes the building of the device much easier and more practical. If the angle is more than 45 degrees, P will be smaller than F, which makes this configuration suitable for installing on the roads and under large forces. By increasing the angle, we make sure that the applied force on the segmented beam will not exceed the allowable amount and will not result in breaking the beam.

Modeling and Governing Equations

The partial differential equation governing the vibrations of the piezoelectric beam is derived by combining those of a buckled beam and a piezoelectric energy harvesting bimorph. The mechanical governing equation is:

$$m\frac{\partial^2 w}{\partial t^2} + c\frac{\partial w}{\partial t} + EI\frac{\partial^4 w}{\partial x^4} + \left[P - \frac{K_{eq}}{2}\int_0^L\left(\frac{\partial w}{\partial x}\right)^2 dx\right]\frac{\partial^2 w}{\partial x^2} + \alpha\left[\frac{d\delta(x)}{dx} - \frac{d\delta(x-L)}{dx}\right]V(t) = 0 \tag{2}$$

Where m is the total mass per unit length of the beam, w(x,t) is deflection along the y-axis FIG. 1), EI is the equivalent bending stiffness of the composite beam, P is the axial force, $K_{eq}$ is the equivalent stiffness of the active beam, α is the piezoelectric coupling coefficient, and V is the voltage across the piezoelectric elements that are connected in parallel. The width of the beam is noted by b the thickness of the substrate is $t_s$, and the thickness of the piezoelectric layer is $t_p$. δ(x) is the Dirac delta function that satisfies:

$$\int_{-\infty}^{+\infty}\frac{d^{(n)}\delta(x-x_0)}{dx^{(n)}}f(x)dx = (-1)^n\frac{df^{(n)}(x_0)}{dx^{(n)}} \tag{3}$$

The coupling term α for the parallel connection can be written as:

$$-2\int_{\frac{t_s}{2}}^{t_p + \frac{t_s}{2}} e_{13}\frac{b}{t_p} z\, dz = -2be_{13}\frac{t_p + t_s}{2} \tag{4}$$

Where $e_{13}$ is a piezoelectric coefficient. If the force is more than the critical buckling force, the beams buckle. In this disclosure, we assume that the force is larger than the first critical load and is less than the critical load of the higher modes. So, we only need to consider the first buckling mode shape in our calculations. For both buckled and unbuckled cases, the free vibration mode shapes are considered as the mode shapes. The equation for free vibration of the beam can be expressed as:

$$A\frac{\partial^2 w}{\partial t^2} + EI\frac{\partial^4 w}{\partial x^4} = 0 \tag{5}$$

The solution for the free vibration can be shown as a linear combination of all natural motions of the beam (Section 11):

$$w(x,t) = \Sigma_{j=1}^{\infty}\phi_j(x)T_j(t) \tag{6}$$

Where $\phi_j$ is jth natural mode shape and $T_j$ is the temporal function. Substituting Eq. (6) in Eq. (5), the general solution for a segmented beam can be found in the form of:

$$\phi_{ji}(x) = \tag{7}$$
$$a_{i1}\sin\left(\frac{\beta_j}{\sqrt{C_i}}x\right) + a_{i2}\cos\left(\frac{\beta_j}{\sqrt{C_i}}x\right) + a_{i3}\sinh\left(\frac{\beta_j}{\sqrt{C_i}}x\right) + a_{i4}\cosh\left(\frac{\beta_j}{\sqrt{C_i}}x\right)$$

Where i is the ith beam section and j shows the jth mode shape, $a_{i1}, a_{i2}, a_{i3}, a_{i4}$ and $\beta_j$ are calculated from the boundary conditions, and $C_i$ is:

$$C_i = \sqrt{\frac{E_i I_i}{\rho_i A_i}} \tag{8}$$

In case of the uniform simply supported beam Eq. (7) reduces to:

$$\phi_j(x) = A\sin\left(j\frac{\pi x}{L}\right) \tag{9}$$

Since the vibration mode shapes of a segmented beam does not stay the same as a uniform beam, the general form of a free vibration of a beam (Eq. (7)) is considered for each part. The beam has three segments; therefore, the deflection shapes are different for each part. So, there are in total 12 unknown coefficients ($a_{11}, a_{12}, \ldots, a_{34}$). There are four boundary conditions at the two ends. The deflection (φ) and bending moment (EIφ") are zero.

Because of continuity and equilibrium conditions, we have four conditions at each of the interfaces. In other words, at these points, the two sides should have the same deflection, slope, shear force, and bending moment. Four boundary conditions at the two ends and eight equations at the two interfaces form the following 12 equations:

$$\begin{cases} \phi_{j1}(0) = 0 \\ \phi_{j3}(l_1 + l_2 + l_3) = 0 \\ \phi''_{j1}(0) = 0 \\ \phi''_{j3}(l_1 + l_2 + l_3) = 0 \\ \phi_{j1}(l_1) = \phi_{j2}(l_1) \\ \phi'_{j1}(l_1) = \phi'_{j2}(l_1) \\ E_1 I_1 \phi''_{j1}(l_1) = E_2 I_2 \phi''_{j2}(l_1) \\ E_1 I_1 \phi^{(3)}_{j1}(l_1) = E_2 I_2 \phi^{(3)}_{j2}(l_1) \\ \phi_{j2}(l_1 + l_2) = \phi_{j3}(l_1 + l_2) \\ \phi'_{j2}(l_1 + l_2) = \phi'_{j3}(l_1 + l_2) \\ E_2 I_2 \phi''_{j2}(l_1 + l_2) = E_3 I_3 \phi''_{j3}(l_1 + l_2) \\ E_2 I_2 \phi^{(3)}_{j2}(l_1 + l_2) = E_3 I_3 \phi^{(3)}_{j3}(l_1 + l_2) \end{cases} \quad (10)$$

Where $\phi_{j1}$ is the deflection of the first part, $\phi_{j2}$ is the deflection of the middle part of the beam, $\phi_{j3}$ is the deflection of the third part of the beam. E and I are the elastic modulus and moment of inertia. $\phi'_{ji}$ shows the slope in each part, $E_i I_i \phi''_{ji}$ is the bending moment of the beam, and $E_i I_i \phi^{(3)}_{ji}$ is the shear force of the beam. One way to find these coefficients is to get the 12 equations and write them in the matrix form:

$$BA = 0 \quad (11)$$

Where B is a 12×12 matrix and A is defined as:

$$A = [a_{11} a_{12} a_{13} a_{14} a_{21} a_{22} a_{23} a_{24} a_{31} a_{32} a_{33} a_{34}]^T \quad (12)$$

Figure 5:
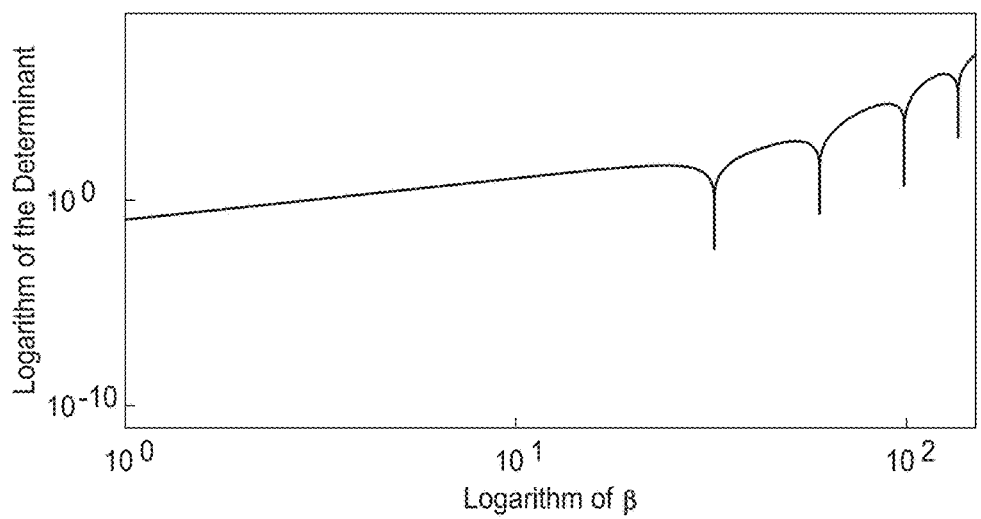
FIG. 5 is a graph of the logarithm of the determinant of matrix B vs. logarithm of different $\beta$.

Non-trivial solutions only exist if the determinant of matrix B is zero. In order to find the β that makes the determinant zero, we plot the logarithm of the determinant of matrix B in terms of different βs. The first drop in the plot of FIG. 5 is associated with the frequency of the first mode shape. To find the exact frequency we use Newton-Raphson method using that frequency as the initial guess. The second drop in the plot is the frequency of the second mode shapes and the next drops are associated with the next national frequencies. In this paper, we need just the first two frequencies in order to find the first two mode shapes and their critical buckling force.

If the determinant of B matrix is zero, there is not a unique answer for the set of the equations. So in order to solve them, one equation should be eliminated. Next, a value for one of the components of the vector A is assumed and other 11 remaining coefficients are found based on that component. We need to check to see if the choice of the arbitrary component has been proper. In some cases that assumed component in the coefficient vector is zero. It means that our first assumption is not correct and we need to take another element as the assumed component. In order to check to see if the assumption is correct, we remove one row and one column of the matrix B. The column is the column associated with that assumed coefficient. After removing one row and that column, we check the rank of the remaining square matrix. If the rank is n−1, 11 in this case, it means our assumption was correct and we can proceed. But if the rank is less than n−1 it means we need to remove another row instead of the one which was removed and check the ranking again. If all these matrices formed after removing one row fail to have the rank of n−1, it means that our first assumption has not been proper and we need to take another element as the assumed component.

The second way to find the coefficient is to reduce the 12×12 matrix using transformation matrices. In this paper, we name it as transformation matrices method wherever we want to refer to using this way of reducing the size of the initial matrix. By using this method we should calculate the determinant of a 4×4 matrix instead of a 12×12 matrix. This method would show a significant difference in calculation time when we have large matrices. Although in our case the first matrix (12×12) is not very big, due to the high number of numerical calculations for the optimization of the device, we use the transformation matrices method. This method is very useful and time saving when it comes to the optimization part. In order to find the optimized thickness or length of the beam, we need new numerical calculations for every configuration. Considering the number of different configurations, using this method reduces the overall time of the calculations significantly.

As it was mentioned earlier we have two boundary conditions at each end of the beam, totaling four conditions. Considering these boundary conditions at the two ends of the beam we have:

$$[B_{C0}]_{2\times 4} \begin{bmatrix} a_{11} \\ a_{12} \\ a_{13} \\ a_{14} \end{bmatrix} = 0, \quad [B_{Ce}]_{2\times 4} \begin{bmatrix} a_{31} \\ a_{32} \\ a_{33} \\ a_{34} \end{bmatrix} = 0 \quad (13)$$

Where $B_{C0}$ and $B_{Ce}$ are written based on the Eq. (10):

$$B_{C0} = \begin{bmatrix} 0 & 1 & 0 & 1 \\ 0 & -1 & 0 & 1 \end{bmatrix} \quad (14)$$

$$B_{Ce} = \begin{bmatrix} \sin(q_{j3}x^*) & \cos(q_{j3}x^*) & \sinh(q_{j3}x^*) & \cosh(q_{j3}x^*) \\ -E_3 I_3 q_{j3}^2 \sin(q_{j3}x^*) & -E_3 I_3 q_{j3}^2 \cos(q_{j3}x^*) & E_3 I_3 q_{j3}^2 \sinh(q_{j3}x^*) & E_3 I_3 q_{j3}^2 \cosh(q_{j3}x^*) \end{bmatrix}$$

$x^*$ is $l_1 + l_2 + l_3$. Also, there are four equations relating the first part to the second and there are four more equations relating the second part of the beam to the third part (deformation of the beam is continuous).

$$[L_i]_{4\times 4} \begin{bmatrix} a_{i1} \\ a_{i2} \\ a_{i3} \\ a_{i4} \end{bmatrix} = [R_{i+1}]_{4\times 4} \begin{bmatrix} a_{(i+1)1} \\ a_{(i+1)2} \\ a_{(i+1)3} \\ a_{(i+1)4} \end{bmatrix} \quad (15)$$

Where $$L_i = \begin{bmatrix} \sin(q_{ji}x^*) & \cos(q_{ji}x^*) & \sinh(q_{ji}x^*) & \cosh(q_{ji}x^*) \\ q_{ji}\cos(q_{ji}x^*) & -q_{ji}\sin(q_{ji}x^*) & q_{ji}\cosh(q_{ji}x^*) & q_{ji}\sinh(q_{ji}x^*) \\ -E_iI_iq_{ji}^2\sin(q_{ji}x^*) & -E_iI_iq_{ji}^2\cos(q_{ji}x^*) & E_iI_iq_{ji}^2\sinh(q_{ji}x^*) & E_iI_iq_{ji}^2\cosh(q_{ji}x^*) \\ -E_iI_iq_{ji}^3\cos(q_{ji}x^*) & E_iI_iq_{ji}^3\sin(q_{ji}x^*) & E_iI_iq_{ji}^3\cosh(q_{ji}x^*) & E_iI_iq_{ji}^3\sinh(q_{ji}x^*) \end{bmatrix} \quad (16)$$

$$R_{i+1} = \begin{bmatrix} \sin(q_{j(i+1)}x^*) & \cos(q_{j(i+1)}x^*) & \sinh(q_{j(i+1)}x^*) & \cosh(q_{j(i+1)}x^*) \\ q_{j(i+1)}\cos(q_{j(i+1)}x^*) & -q_{j(i+1)}\sin(q_{j(i+1)}x^*) & q_{j(i+1)}\cosh(q_{j(i+1)}x^*) & q_{j(i+1)}\sinh(q_{j(i+1)}x^*) \\ -E_{(i+1)}I_{(i+1)}q_{j(i+1)}^2\sin(q_{j(i+1)}x^*) & -E_{(i+1)}I_{(i+1)}q_{j(i+1)}^2\cos(q_{j(i+1)}x^*) & E_{(i+1)}I_{(i+1)}q_{j(i+1)}^2\sinh(q_{j(i+1)}x^*) & E_{(i+1)}I_{(i+1)}q_{j(i+1)}^2\cosh(q_{j(i+1)}x^*) \\ -E_{(i+1)}I_{(i+1)}q_{j(i+1)}^3\cos(q_{j(i+1)}x^*) & E_{(i+1)}I_{(i+1)}q_{j(i+1)}^3\sin(q_{j(i+1)}x^*) & E_{(i+1)}I_{(i+1)}q_{j(i+1)}^3\cosh(q_{j(i+1)}x^*) & E_{(i+1)}I_{(i+1)}q_{j(i+1)}^3\sinh(q_{j(i+1)}x^*) \end{bmatrix} \quad (17)$$

In which $$q_{ji} = \left(\frac{\beta_j}{\sqrt{C_i}}\right) \quad (18)$$

$x^*$ is $l_1$ or $l_1+l_2$ depending on if we write the continuity and equilibrium equations at the intersection of the first segment with the second segment or if we write them at the intersection of second segment with the third segment. Finally we have:

$$[B_{C0}]_{2\times 4}\begin{bmatrix} a_{11} \\ a_{12} \\ a_{13} \\ a_{14} \end{bmatrix} = 0 \quad (19)$$

And:

$$[R_3]^{-1}[L_2][R_2]^{-1}[L_1]\begin{bmatrix} a_{11} \\ a_{12} \\ a_{13} \\ a_{14} \end{bmatrix} = \begin{bmatrix} a_{31} \\ a_{32} \\ a_{33} \\ a_{34} \end{bmatrix} \quad (20)$$

If we combine Eq. (19) and Eq. (20) we end up with:

$$\begin{bmatrix} [B_{C0}]_{2\times 4} \\ [B_{Ce}]_{2\times 4}[[R_3]^{-1}[L_2][R_2]^{-1}[L_1]]_{4\times 4} \end{bmatrix}\begin{bmatrix} a_{11} \\ a_{12} \\ a_{13} \\ a_{14} \end{bmatrix} = 0 \quad (21)$$

The matrix B accordingly is defined as:

$$B = \begin{bmatrix} [B_{C0}]_{2\times 4} \\ [B_{Ce}]_{2\times 4}[[R_3]^{-1}[L_2][R_2]^{-1}[L_1]]_{4\times 4} \end{bmatrix}_{4\times 4} \quad (22)$$

We next find the value of β that makes the determinant of matrix B equal zero. Comparing the number of equations in Eq. (10) and the size of the matrix in Eq. (22) shows that the size of the initial coefficient matrix (12×12) is reduced to a 4×4 matrix. As it mentioned before, the main advantage of using transformation matrices method is reducing the matrix size which decreases the numerical calculation significantly. When the size of the initial matrix increases, the decrease in overall time of the calculations is considerable. Also, another advantage of this formulation is avoiding extremely large values of determinant which might cause numerical errors.

In our calculation we use the mass normalized mode shapes such that they satisfy the condition given by:

$$\int_0^L \phi_{ij}(x)m_i\phi_{ij}(x)dx=1 \quad (23)$$

Figure 6:
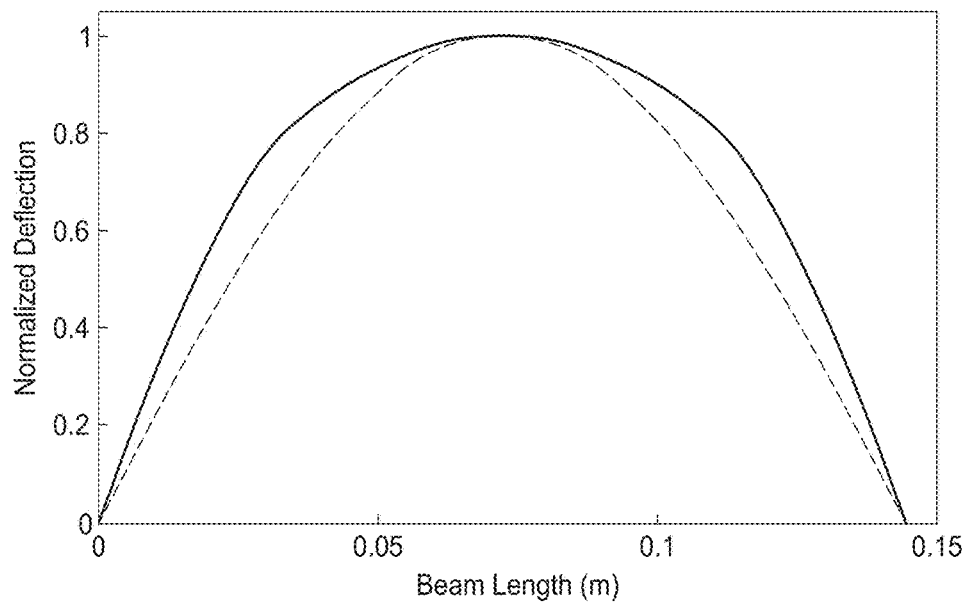
FIG. 6 is a table that illustrates deflection of uniform beam (dashed line) vs. segmented beam with two piezoelectric layers in the middle.

FIG. 6 compares the deformation shape of a segmented deflected beam under axial force and that of a uniform beam. For verification of the method, we consider a special case: we assume that the thickness of the piezoelectric layer in the middle section is zero. As expected, the deflection shape is identical to that of a uniform beam. The critical buckling force is checked for both cases and they are also the same.

After finding the deflection of the beam we replace w(x,t) with $w(x,t)=\sum_{j=1}^{\infty}\phi_j(x)T_j(t)$ in Eq. 2 and we pre-multiply the equation by the mode shape. If we integrate the expression from zero to the length of the beam:

$$m\int_0^L \phi_k \sum_{j=1}^{\infty}\phi_j(x)\ddot{T}_j(t)dx + \\ c\int_0^L \phi_k \sum_{j=1}^{\infty}\phi_j(x)\dot{T}_j(t)dx + EI\int_0^L \phi_k \sum_{j=1}^{\infty}\phi_j^{(4)}(x)T_j(t)dx + \\ \left[P - \frac{K_{eq}}{2}\int_0^L \sum_{j=1}^{\infty}\phi_j'^2(x)T_j(t)dx\right]\int_0^L \phi_j''(x)T_j(t)dx + \\ \alpha\int_0^L \phi_k\left[\frac{d\delta(x)}{dx} - \frac{d\delta(x-L)}{dx}\right]V(t)dx = 0 \quad (24)$$

Due to orthogonally of the mode shapes the equations get decoupled:

$$M_k\ddot{T}+c\dot{T}+(K_k+p_k)T+N_kT^3+B_kV(t)=0 \quad (25)$$

Where $M_k$ is the modal mass of the kth mode. As mentioned before, we consider mass normalized mode shapes; c is the damping ration, K stands for the linear stiffness, the reduction of the stiffness coefficient due to the axial force is p, N is the nonlinear coefficient, and the coupling coefficient is β. These integrals were calculated analytically for a uniform beam:

$$\begin{cases} M = m \int_0^L \phi^2(x)dx = \frac{mA^2L}{2} \\ K = EI \int_0^L \phi^{(4)}(x)\phi(x)dx = A^2 EI \frac{\pi^4}{2L^3} \\ p = -P \int_0^L \phi''(x)\phi(x)dx = A^2 P \frac{\pi^2}{2L} \\ N = -\frac{K_{eq}}{2} \int_0^L \phi'^2(x)dx \int_0^L \phi''(x)\phi(x)dx = A^4 EA \frac{\pi^4}{8L^3} \\ \beta = \alpha[\phi'(L) - \phi'(0)] = -2\alpha A \frac{\pi}{L} \end{cases} \quad (26)$$

The integrals in Eq. (26) were calculated numerically. The critical buckling force of the beam is the amount of axial force, P, that makes p equal to K.

Figure 7:
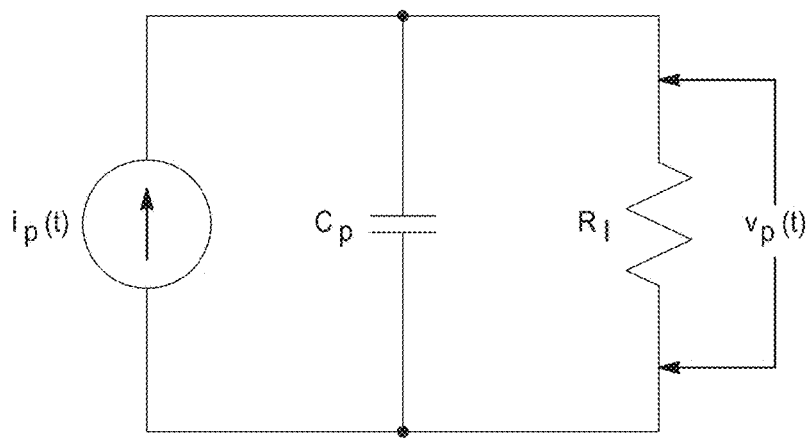
FIG. 7 illustrates electrical circuits for the harvester.

FIG. 7 shows the equivalent electrical circuit for the energy harvester. The governing equation using Kirchloff's law is:

$$C_p \dot{V} + \frac{V}{R_l} = -\beta \dot{T} \quad (27)$$

Where $R_l$ is load resistance, and the capacitance of the piezoelectric is $$C_p = n\epsilon_0 \frac{Lb}{t_p},$$

in which n is number of piezoelectric layers (2 in our device). The governing equations before the stop is engaged are:

$$\begin{cases} M\ddot{T} + c\dot{T} + (K-p)T + NT^3 + \beta V(t) = 0 \\ C_p \dot{V} + \frac{V}{R_l} = -\beta \dot{T} \end{cases} \quad (28)$$

If the axial force is less than the critical load, zero deflection would be a stable equilibrium point. When the axial force surpasses the first critical load, the modal coordinate representing the nonlinear equilibrium point is:

$$T^2 = \frac{(p-K)}{N} \quad (29)$$

The governing differential equations in Eq. (2) are valid before the stop is engaged. When the support is engaged, the tire force is applied to the support and Eq. (28) is not valid. In that situation the axial displacement of the beam is fixed at the designed recess (FIG. 2). In this situation, the problem changes from a fixed axial forced problem to a fixed axial displacement problem. The governing equations for the vibration of an axially displaced beam is presented as:

$$m\frac{\partial^2 w}{\partial t^2} + c\frac{\partial w}{\partial t} + EI\frac{\partial^4 w}{\partial x^4} + \left[K_{eq}\Delta - \frac{K_{eq}}{2}\int_0^L \left(\frac{\partial w}{\partial x}\right)^2 dx\right]\frac{\partial^2 w}{\partial x^2} = 0 \quad (30)$$

The model manifested in Eq. (30) implies that the effect of an axial fixed displacement of $\Delta$ is equal to the effect of an axial force of $K_{eq}\Delta$. Unfortunately this model does not seem to be correct. The first incorrect result of Eq. (3) is on the static axial deformation of the beam. In static situation the axial deformation of the beam must be equal to $\Delta$. The axial deformation of the beam is given by:

$$d = \int_0^L \frac{1}{2}\left(\frac{\partial w}{\partial x}\right)^2 dx \quad (31)$$

For a uniform beam the axial deformation resulted from Eqs. (30) and (31) is $$d = \Delta - \frac{AL}{I\pi^2}.$$

This contradicts the boundary conditions. We suggest that the correct equivalent axial force should be $$K_{eq}\Delta + p_c = K_{eq}\Delta + \frac{EI\pi^2}{L^2}$$

where $p_c$ is the critical load. This value is consistent with $d=\Delta$. The difference between the two values becomes obvious in the following thought experiment. Assume that the distance between the hinges is a slight amount ($\epsilon$) shorter than the original length. Since the shortening of the neutral axis is negligble the beam has to buckle to accommodate to the boundary conditions. The equivalent axial force should therefore be larger than the critical buckling load. This condition is satisfied by our corrected equivalent load but is contradicted with the expression in the prior art (see Ref. 34 in Exhibit A). So, we suggest that the correct formula is:

$$m\frac{\partial^2 w}{\partial t^2} + c\frac{\partial w}{\partial t} + EI\frac{\partial^4 w}{\partial x^4} + \left[K_{eq}\Delta + p_c - \frac{K_{eq}}{2}\int_0^L \left(\frac{\partial w}{\partial x}\right)^2 dx\right]\frac{\partial^2 w}{\partial x^2} = 0 \quad (32)$$

Thus, after the stop is engaged, instead of Eq. (28) the governing equations are:

$$\begin{cases} M\ddot{T} + c\dot{T} + (K-p_e)T + NT^3 + \beta V(t) = 0 \\ C_p \dot{V} + \frac{V}{R_l} = -\beta \dot{T} \end{cases} \quad (33)$$

The parameters definitions are similar to those in Eq. (28). The only difference is the reduction of the stiffness coefficient due to the axial force:

$$p_e = -(P_{stp} + P_c)\int_0^L \phi''(x)\phi(x)dx \quad (34)$$

In this equation $P_c$ is the first critical load for buckling and $P_{stp}$ is the reaction force from the beam in the point when the stop is hit. For the segmented configuration we have:

$$P_{stp} = K_{eq}d_{max} \quad (35)$$

Where $d_{max}$ is the shortening in the beam when the stop is hit and $K_{eq}$ is the equivalent stiffness of the segmented beam.

$$\frac{1}{K_{eq}} = \frac{L_1}{E_1 A_1} + \frac{L_2}{E_2 A_2} + \frac{L_3}{E_3 A_3} \qquad (36)$$

As it is mentioned, the critical force for buckling is defined as the amount of force that makes a linear part of Eq. (28) zero (p=K). So, the critical force is:

$$P_c = -\frac{EI \int_0^L \phi^{(4)}(x)\phi(x)dx}{\int_0^L \phi''(x)\phi(x)dx} \qquad (37)$$

For a uniform beam the value of $p_e$ and $p_c$ are equal to:

$$p_e = A^2 \left(\frac{EA}{L}d + p_c\right)\frac{\pi^2}{2L} \qquad (38)$$

$$p_c = EI \frac{\pi^2 n^2}{L^2}$$

where n is the number of the buckling mode. For the vertical configuration, the maximum shortening of the beam ($d_{max}$) is equal to the gap between the device and the support ($\Delta$). Based on Eq. (1), for the horizontal configuration the equation which relates these two values is:

$$\Delta = d_{max} \cot(\theta) \qquad (39)$$

Design

When there is a force over the device, the beam buckles. This buckling causes a transient vibration, which generates electricity. The buckling continues until the stop is hit. Based on the equation for shortening of the beam (Eq. (31)), the amount of maximum shortening of the beam ($d_{max}$) is proportional to the second power of the maximum allowable strain in the beam ($\epsilon_{max}^2$):

$$d_{max} \propto \epsilon_{max}^2 \qquad (40)$$

The allowable strain is related to the allowable stress as:

$$\epsilon_{maxs} = \frac{\sigma_{ys}}{E_s}, \qquad (41)$$

$$\epsilon_{maxp} = \frac{\sigma_{yp}}{E_p}$$

$\sigma_{yp}$, $\sigma_{ys}$ is the yield stress for steel and piezoelectric and $E_p$, $E_s$ is the module of elasticity for the piezoelectric material and the substrate. For the segmented beam, we do not have the exact equation which relates $d_{max}$ to $\epsilon_{max}$. In order to find $d_{max}$, first the shortening of the beam, $d_0$, and $\epsilon_0$ are calculated. $\epsilon_0$ is the maximum strain in the beam based on the deformation for the beam. It should be noted that this value is different from maximum allowable strain in the beam ($\epsilon_{max}$) which is calculated from Eq. (41).

$$d_0 = \int_0^L \frac{1}{2}\left(\frac{\partial w}{\partial x}\right)^2 dx \qquad (42)$$

$$\epsilon_{0p} = \left(t_p + \frac{t_s}{2}\right) \cdot \text{Max}[\phi_1''(x)],$$

$$\epsilon_{0s} = \left(\frac{t_s}{2}\right) \cdot \text{Max}[\phi_1''(x)]$$

Note that for the uniform beam the maximum strain occurs at the middle of the beam. In the next step, based on Eqs. (40) and (42) we can find the maximum allowable shortening in the beam ($d_{max}$). In order to find $d_{max}$ we should calculate this value both for substrate and the piezoelectric layer:

$$d_{maxs} = \frac{\epsilon_{maxs}^2}{\epsilon_{0s}^2} d_0, \qquad (43)$$

$$d_{maxp} = \left(\frac{\epsilon_{maxp}^2}{\epsilon_{0p}^2}\right) d_0$$

Each of these values was less, should be considered as the maximum shortening of the beam. Using maximum shortening, we can find the value for $\Delta$. The support location, identified by the gap $\Delta$, should be adjusted to prevent fracture of the beam. The other thing we should notice in designing the device is that the system is designed to have low damping coefficient to enhance the power generation. As a result the beam might buckle more than the static buckling. So, extra caution should be taken in defining the gap value to avoid fracture in the piezoelectric beam.

The solution is divided into different parts: The first part is when the force is over the device and the beam moves down until it hits the support. In this part, Eq. (2) is the governing equation for the vibration of the piezoelectric beam. After the beam buckles the support is engaged, Eq. (32) is the governing equation of the system. When the force is removed, the piezoelectric beam tends to spring back and Eq. (2) gives the solution of the system. Since there is no force over the harvester in this situation, p equals to zero in the equation. Since both equations (2) and (32) are nonlinear, we therefore use numerical integrations to solve the model and predict the power generated by the energy harvesting device.

Figure 8:
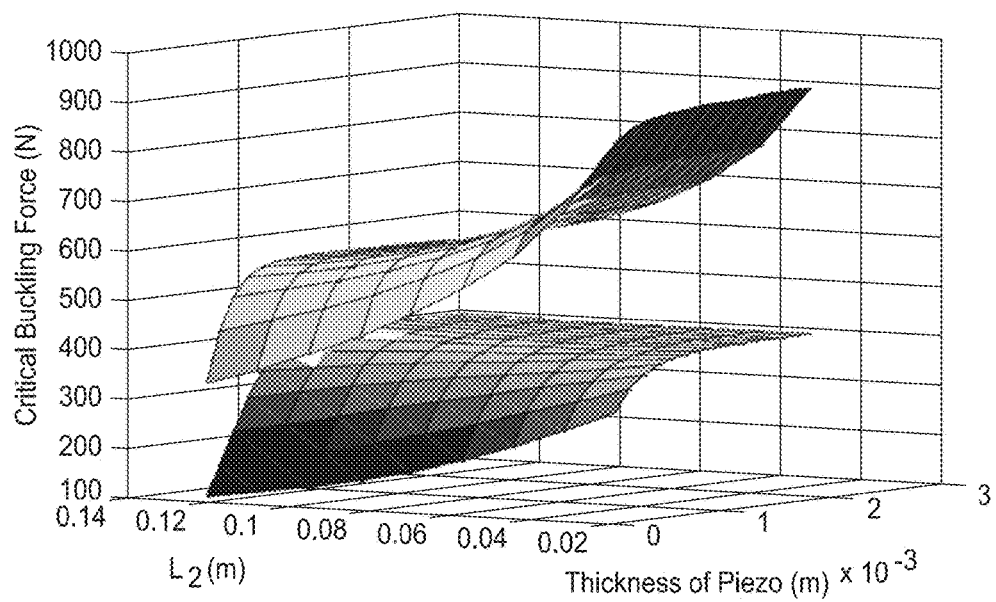
FIG. 8 illustrates first critical buckling force (lower surface) vs. second critical buckling force.

To design the device we need to make sure that the axial stress is less than the yield stress of piezoelectric and substrate parts of the beam. If the force exceeds this limit, the axial stress will break the harvester. The horizontal configuration could be implemented in treadmills or sidewalks, using loads of passing crowds over the harvester. So, the amount of force we expect on the upper beam is about human weight. Since this force would become larger in the case of jumping or running over the device, we consider a safety factor in our design. The same as horizontal design, for the vertical configuration, which could be implemented in the roadways generating electricity using the force of the passing cars, we consider a safety factor to make sure the device does not break under the weight of cars. The next step is to check if this force is more than the first critical load of the buckling of the beam. The critical buckling force is calculated based on Eq. (37). In order to calculate the first critical buckling force, the first mode shape needs to be replace as $\phi(x)$ in the Eq. (37) and for calculating the second critical buckling force the second mode shape. Similarly, for calculating the nth buckling critical force, $\phi(x)$ in Eq. (37) is replaced by the nth mode shape. Since there usually is charge cancellation associated with the higher modes, we only utilize the first buckling mode shape in our design. Thus, the force over the piezoelectric beam has to be more than the first critical load and less than the second critical load. First and second critical buckling forces are shown for different thicknesses and lengths of piezoelectric layers. For a uniform simply supported beam, the critical buckling force is calculated using Eq. (38). As the equation shows, the second critical buckling force in a uniform beam is four times the first critical buckling force. The interesting result about the segmented beam is that the ratio of the second to the first critical buckling force changes with the length and thickness of the middle part. FIG. 8 shows the first and second critical buckling force for a segmented beam in vertical configuration. As the length of the middle part decreases, both critical forces and the ratio of them increase. For our design the desired force over the segmented beam should stay between these two surfaces shown in the plot.

Results

In this section we study three different cases. The first one is a uniform beam in the vertical (direct) configuration. The second case is the vertical configuration with a segmented beam. In both cases the force over the device is considered to be weight of a car. The last case is a segmented beam in the horizontal (indirect) configuration. This device is designed to generate electricity using human weight. The output power and the gap size are calculated for all three cases and ultimately the effect of design parameters on the output power and gap size is studied.

Figure 9:
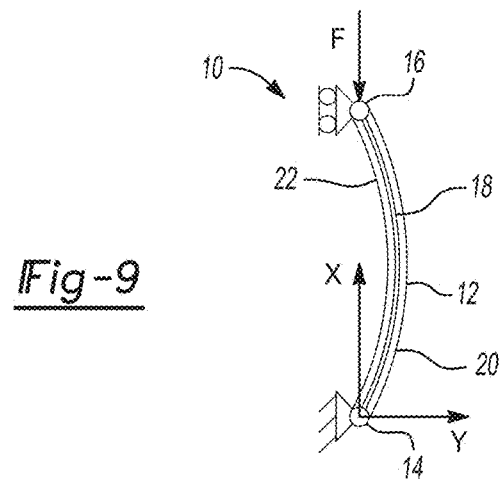
FIG. 9 is a schematic of a uniform beam in a buckled position.

As the first case, we investigate a case study for the direct configuration, using the uniform beam (FIG. 9). A 2 inch (50.8 mm) long and 1 inch (25.4 mm) wide piezoelectric bimorph with 0.02 inch (254 µm) thick steel substrate and 0.01 inch PZT-5A piezoelectric patches meets all the above requirements to be used as the bending element in the vibrational energy harvester. Commercial QuickPacks produced by Mide' are used as the piezoelectric element.

Figure 10A:
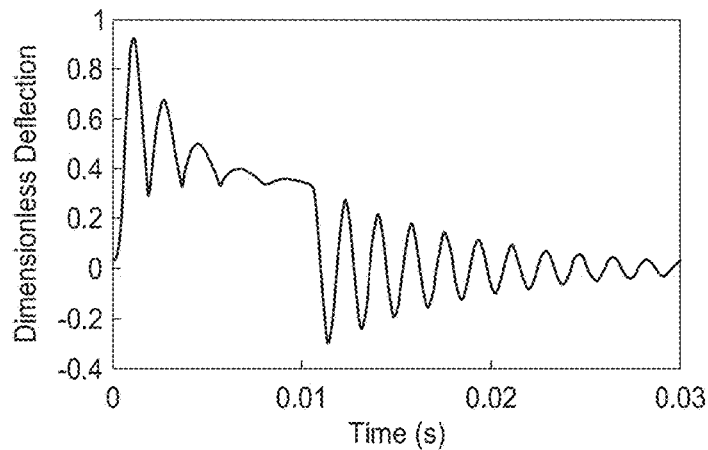
FIG. 10A shows the dimensionless deflection of the beam.

FIG. 10A shows the dimensionless deflection of the beam. The dimension deflection shows the amplitude of the oscillations (w) divided by the amplitude which results yield stress in the beam. When the dimensionless deflection is equal to one the beam is at the border. If this value exceeds one it means the beam is damaged and we need to change the design. If the axial force increases the amplitude of the free oscillations increase and the peaks in the dimension deflection plot gets larger. This increases the amount of output power. Besides, if the time that the force is applied to the device increases, the vibration amplitude decreases till it reaches zero. As this time increases the average output power decreases. It could be concluded that the best power output is achieved if there is a large force over the harvester in a very short time (resembling an impact). It is also interesting that after the engagement of the safety stop, the beam continues to oscillate. In other words, the motion of the beam is completely dynamic and oscillatory at almost every moment.

Figure 10B:
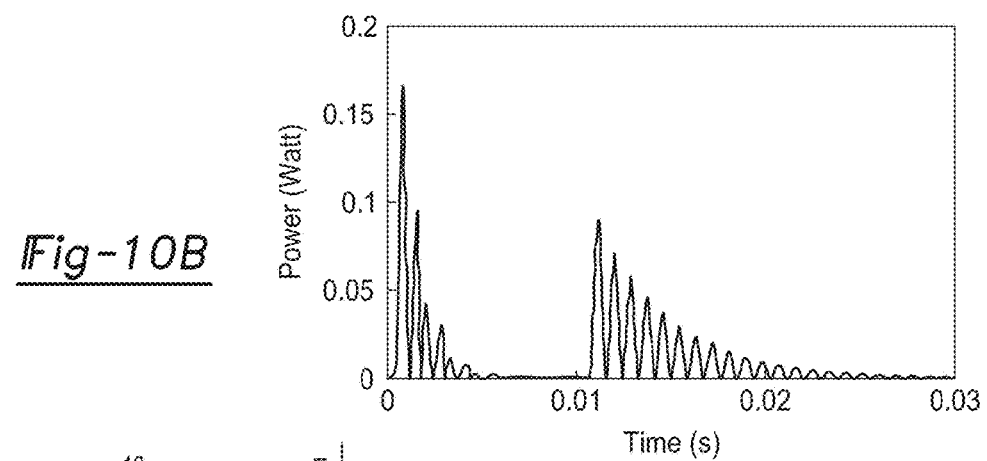
FIG. 10B plots the instantaneous power across an 800Ω resistive load.

The instantaneous power across an 800Ω resistive load is plotted in FIG. 10B the value of the resistive load matches the impedance of the piezoelectric layer when it oscillates under no axial force at its fundamental natural frequency (Eq. (44)). The average power for generated electricity in FIG. 10B is 52 mW. The gap distance is 1.38 µm, which is too small comparing to the device size. This gap size makes this design impractical for being implemented in the roads.

Figure 11:
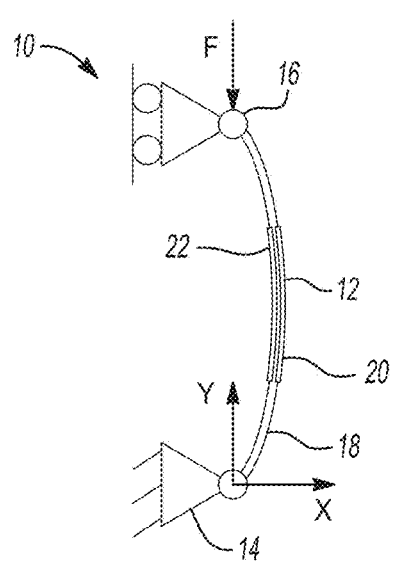
FIG. 11 is a schematic of a vertical segmented beam in the buckled position.

Next, we study both configurations using the segmented beam instead of the uniform beam (FIG. 11). For the direct configuration, PSI-5A4E PIEZO sheets from PIEZO SYSTEMS, INC. can be used as the piezoelectric element. We can use a piezoelectric bimorph beam with 2.85 inches long and 1.00 inch wide with 0.05 inch thick steel substrate and 0.04 inch thick PSI-5A4E (the piezoelectric material) piezoelectric patches. The length of the first and third parts of the beam are 1.425 inches and the length of the middle part is 2.85 inches.

Figure 12A:
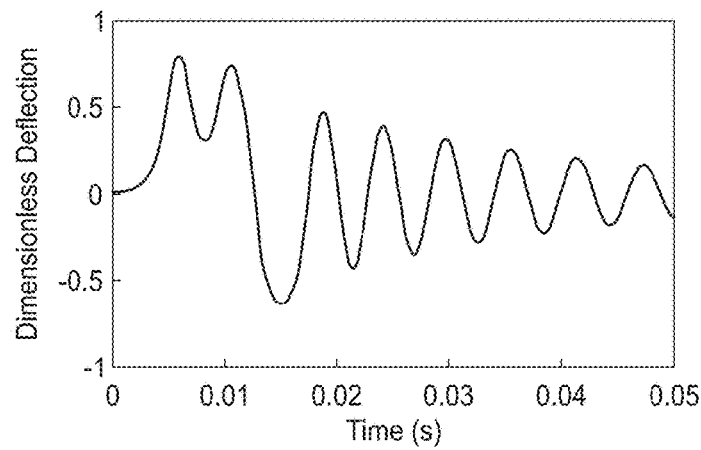
FIG. 12A illustrates the dimensionless deflection of the beam.
Figure 12B:
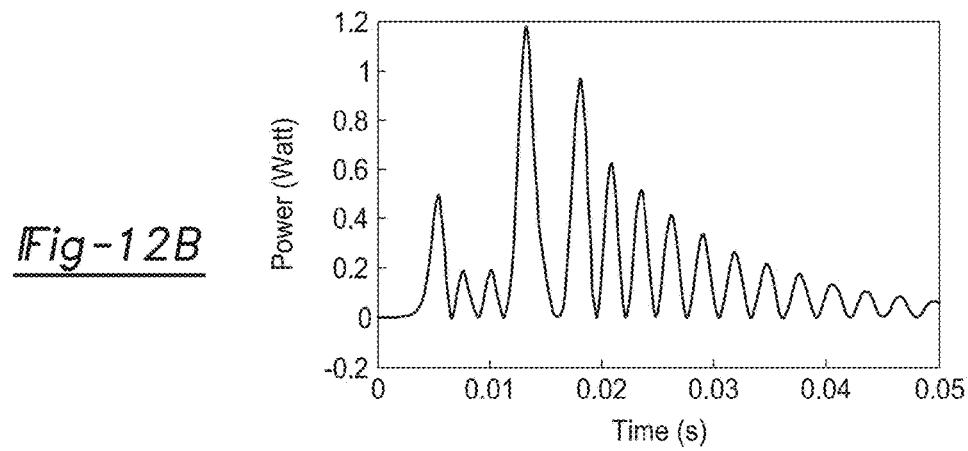
FIG. 12B shows the instantaneous power across a 17.5 kΩ resistive load.

FIG. 12A illustrates the dimensionless deflection of the beam and FIG. 12B shows the instantaneous power across a 17.5 kΩ resistive load.

Figure 13:
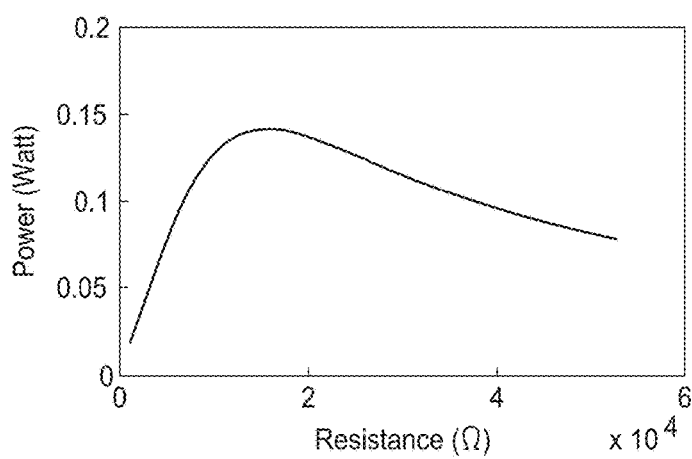
FIG. 13 illustrates average output power vs. different resistances.

As illustrated in the plot, most part of the electricity is generated after the force is removed. To make sure that the optimized resistance is used, the average power $$\left(\frac{V_{rms}^2}{R}\right)$$

for different resistances were calculated. It is shown in FIG. 13 there is a resistance for which the maximum power is generated. When resistance equals 16 kΩ, we have the maximum generated power. Most of the times, this resistance is close to the resistance calculated as:

$$R = \frac{1}{C\omega} \quad (44)$$

Where C is the capacity of the piezoelectric layer and w is the natural frequency of the beam. The duration of force being applied to the harvester is assumed 0.1 seconds. After the force is removed the beam springs back. The average power for generated electricity in FIG. 12B is 176.3 mW.

Figure 14:
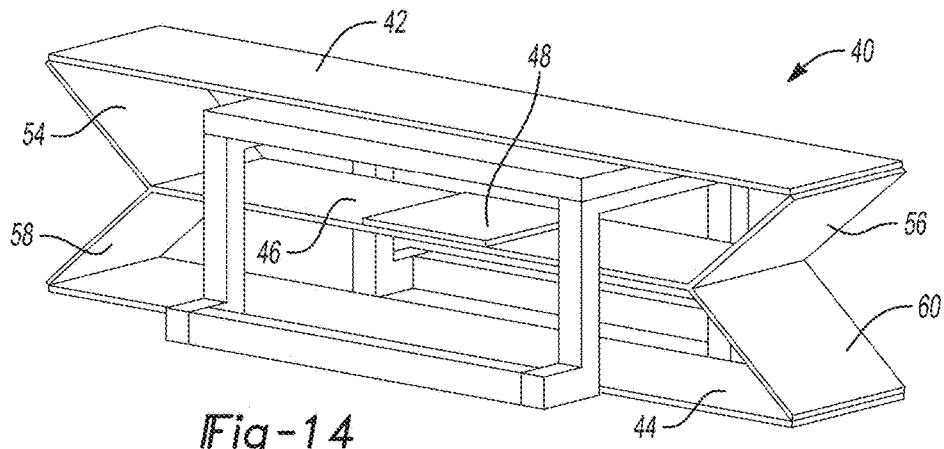
FIG. 14 illustrates a horizontal segmented beam with the support.

For the indirect configuration (FIG. 14), we can use a piezoelectric bimorph beam with 2.85 inches long and 2.85 inches wide with 0.07 inch thick steel substrate and 0.04 thick piezoelectric patches (PSI-5A4E from PIEZO SYSTEMS, INC.). By using this beam in our device we make sure that the force is more than the first critical load and also less than the second critical load. The length of the oblique beams ($L_0$ in FIG. 4) is 3 inches and the angle between the upper beam and oblique beams (θ in FIG. 4) is $$\frac{\pi}{16}.$$

With this angle, we make sure that there is sufficient force for buckling of the beam. If we decrease the angle, the force needed for buckling the device would be less, but having a very small theta angle makes the building of the device impractical and there is always the building limitations that should be considered. The safety factor for the axial load is 13.6 and 2 for the substrate and piezoelectric layers (the yield stress is assumed 40 MPa and 250 MPa for these layers). Since the motion of the beam is oscillatory even after the stop is hit, another safety factor is considered in the last step of the design. The main advantage of this device over the vertical configuration is the increase in the gap between the top beam and support. A larger gap would make the building and implementing of the device much easier.

Figure 15A:
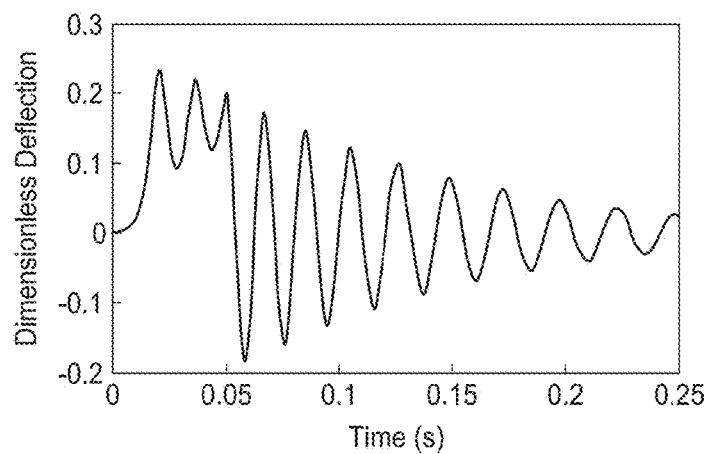
FIG. 15A shows the dimensionless displacement of the segmented beam in the horizontal device.
Figure 15B:
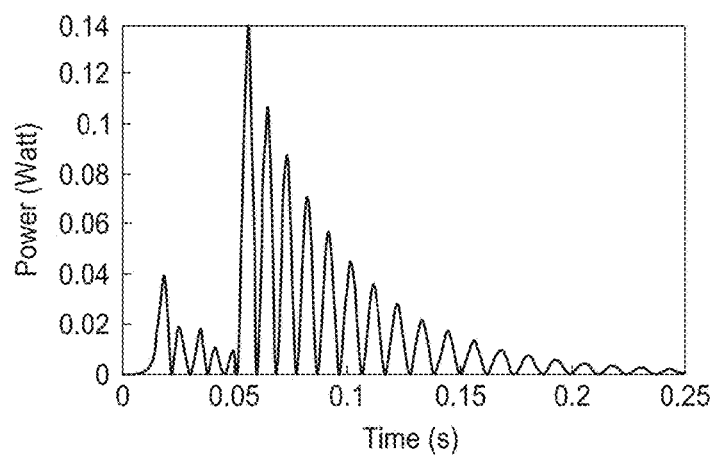
FIG. 15B shows maximum power generated using a 20.4 kΩ resistive load.
Figure 16:
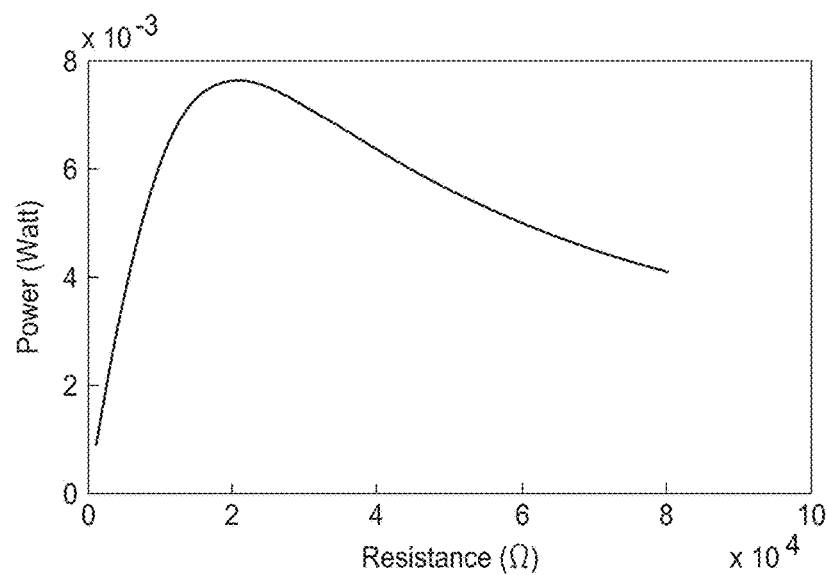
FIG. 16 shows the average power using different resistances.

FIG. 15A shows the dimensionless displacement of the segmented beam in the horizontal device. The duration of force being applied to the harvester is assumed 0.5 seconds. Since the force over the horizontal device is assumed to be human weight, the duration of it (which is the duration of each step) is larger than the vertical case. The same as the vertical configuration after the force is removed, the beam springs back to the zero equilibrium position. The average power generated is 14.4 mW. Considering the fact that we used human weight for generating electricity in the harvester, the generated power is notable. FIG. 16 shows the average power using different resistances. The maximum power is generated using a 20.4 kΩ resistive load (FIG. 15B). Other small forces like force applied by hand could also be used on this device.

As mentioned before the most important advantage of using a segmented beam over uniform beam is the increase in the gap distance where the support is placed. This gap distance even increases more when using a horizontal configuration. The gap distance for the case study of the horizontal device is 0.8 mm, which is larger than vertical configuration (about 10 times) and much larger than uniform beam (more than 500 times).

Figure 17:
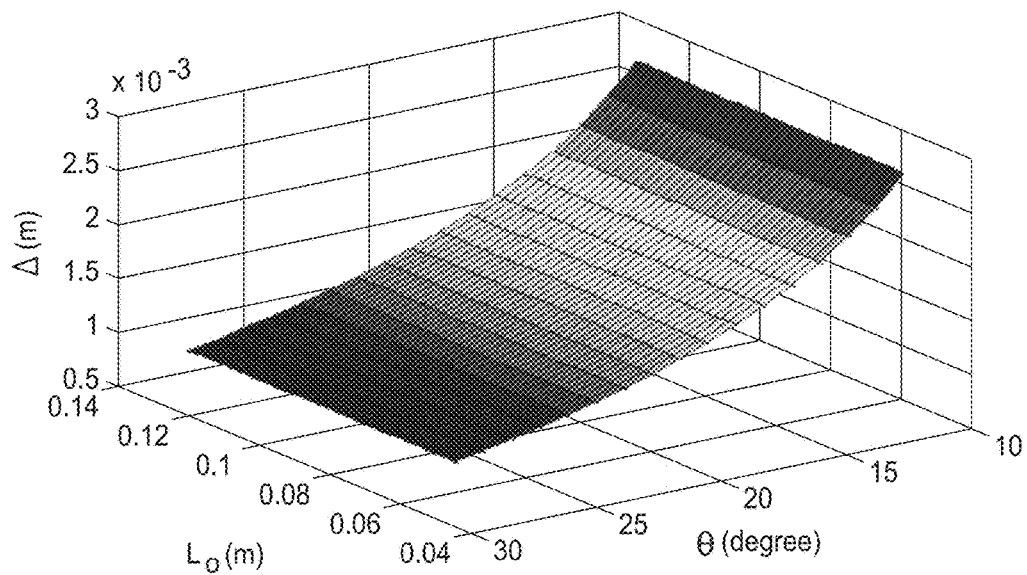
FIG. 17 illustrates the effect of theta angle and length of lateral beam ($L_0$) on the gap distance in horizontal configuration.

In horizontal configuration of the device, by increasing in the theta angle the gap distance increases too. Building limitations should be considered, before decreasing the theta angle to have a larger gap size. The length of the lateral beam does not affect this distance significantly (FIG. 17). So, it could be concluded that one very important parameter in the force applied to the segmented beam and also the gap distance in the horizontal device is the θ angle.

Figure 18:
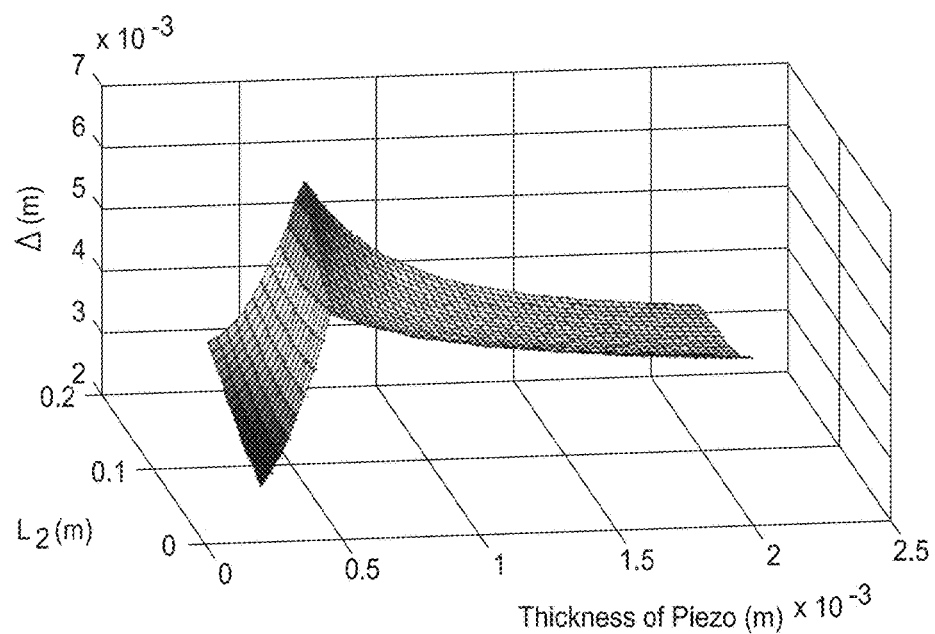
FIG. 18 illustrates the effect of thickness and length of the piezoelectric part on the gap distance.

The effect of the length of the piezoelectric layer and its thickness in the horizontal device is also illustrated in FIG. 18. As it is shown in the figure, Delta (distance where the stop is placed) increases as the length of the piezoelectric layer (the middle part of the beam) increases.

Figure 19:
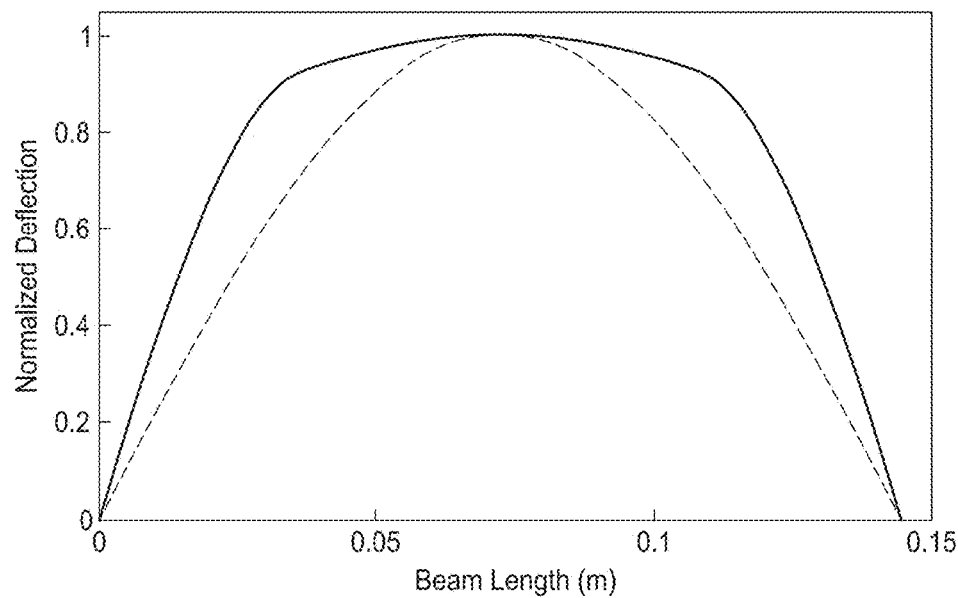
FIG. 19 illustrates the deflection of a segmented beam with thick piezoelectric layer ($t_s$=0.03 in, $t_p$=0.02 in) vs. uniform beam (dashed line).

By increasing the thickness of the piezoelectric layer, at first the gap distance is increasing, but after a point it begins to decrease. The reason is because after a point the thickness of the piezoelectric is not the deciding factor in breaking the beam. For thin piezoelectric layers, substrate will break instead of the piezoelectric layer. So it is crucial to ensure the safety of both piezoelectric layer and the substrate. The deflection shape for a beam with a thick piezoelectric and a thin steel layer is illustrated in the FIG. 19. Because the beam is much thicker in the middle, it is more prone to the damage in the first or third parts where it is connected to the middle part of the beam.

Figure 20:
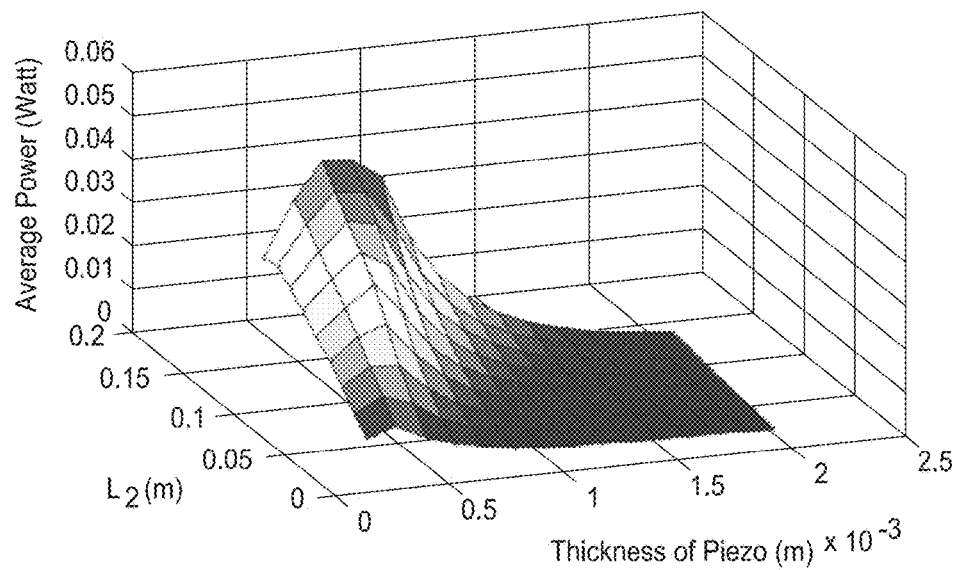
FIG. 20 illustrates the effect of thickness and length of piezoelectric (in meter) part on the average generated power (in Watt).
Figure 21:
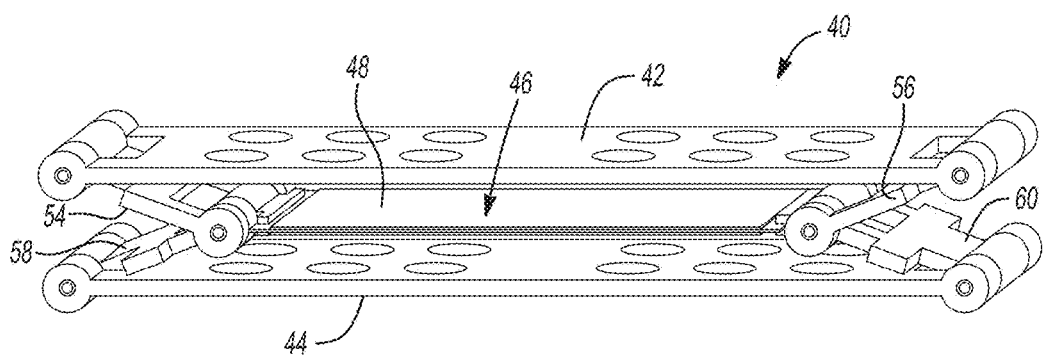
FIG. 21 illustrates a perspective view of the harvester of the present teachings having a single piezoelectric beam.

The effect of the increase in the thickness of the active layer (piezoelectric layer) and also the length of the middle part of the beam on the output power for the vertical device is illustrated in FIG. 20. By increasing the length of the middle part, the generated power of the device increases, too. As the length increases the total stiffness of the beam decreases, which results in more vibration of the beam. When the vibration increases the output power increases, too. As mentioned before, the output power of the beam increases with the thickness of the piezoelectric layer to a certain limit. Beyond that, the stiffness of the middle part of the beam increases and in reality the middle part does not vibrate as much and as a result the generated power decreases.

Alternative Configurations

Testing of the Shoe Energy Harvester (L=11.00", W=3", H=1.87") resulted in a maximum power output of 32.89 mW with the use of a shorter single spring steel beam, which was covered with four piezo patches. This output shows a substantial increase from the projects previous prototype (L=15.75", W=3", H=2") which utilized a longer brass substrate. These results demonstrate that spring steel substrates are worth investigating as its power output exceeds that of any other prototype. This power is generated without using the stop mechanism and it is recommended to use spring steel in the double beam configuration which has a built in stop mechanism. The power output is predicted to be increased when using double beam instead of a single beam.

Figure 22:
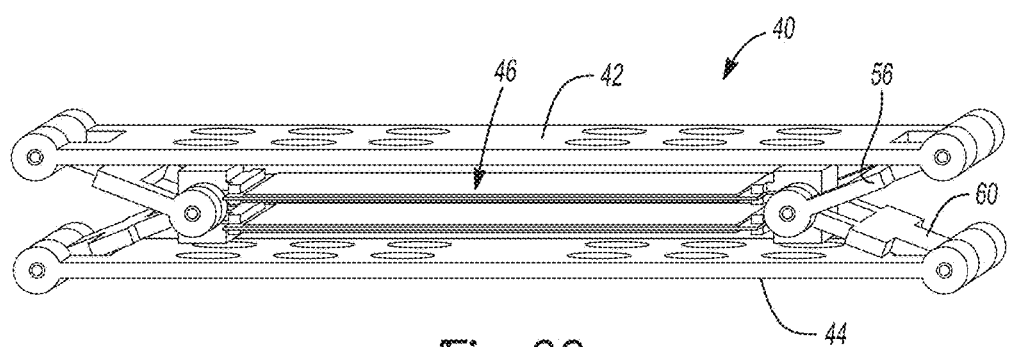
FIG. 22 illustrates a perspective view of the harvester of the present teachings having a double piezoelectric beam.
Figure 23:
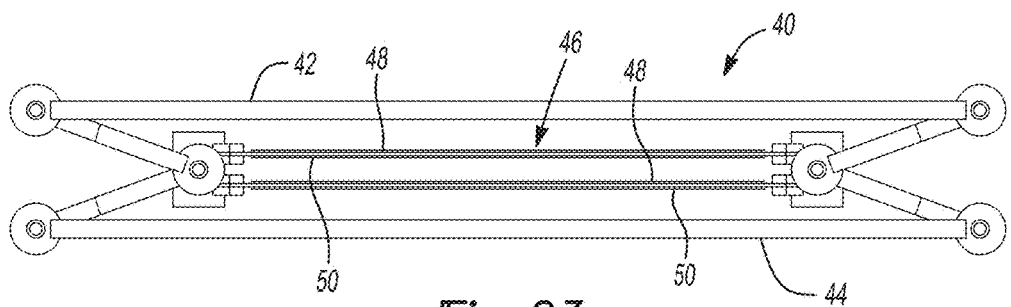
FIG. 23 is a side view of the harvester of FIG. 22.
Figure 24:
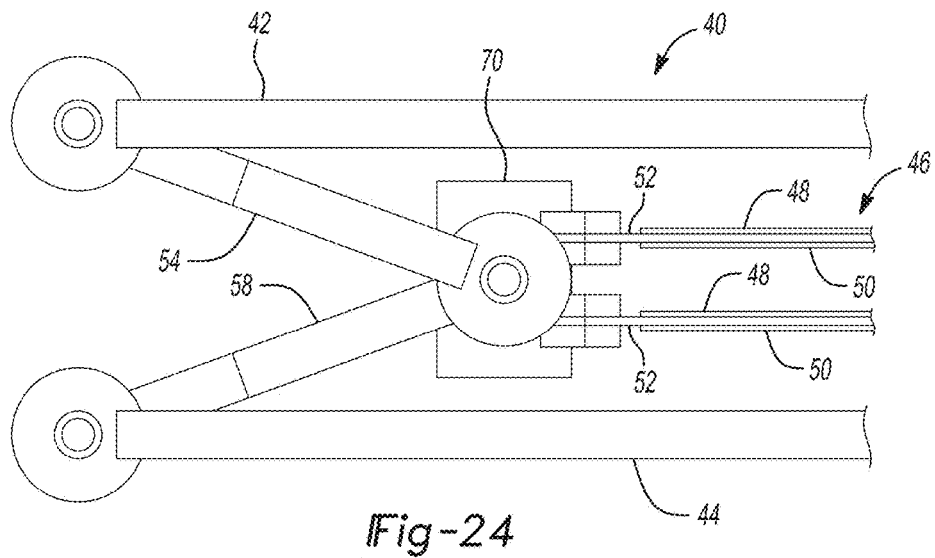
FIG. 24 is an enlarged side view of the harvester of FIG. 22.

As described herein, the present invention, in its horizontal configuration, may include a single-bimorph beam device (see FIGS. 4A, 4B, 14, 21) or a double beam design (FIGS. 22-24). The double beam design provides increased electrical output due to the increased piezoelectric elements. It should be understood that in some embodiments, any number of piezoelectric beams may be used.

In some embodiments, a stop member 70, as illustrated in FIG. 24, can be used to provide a mechanical stop preventing further mechanical deflection of middle beams 46. To this end, stop member 70 can comprise a block member having a dimension sufficient to prevent excessive deflection of middle beams 46 that may cause damage thereof.

CONCLUSION

In this article, generation of electricity from uniform and segmented piezoelectric beams was studied. The mode shapes of the beam were calculated and the electro-mechanical equations were solved for vertical and the introduced horizontal configurations. The load over the harvester, results in buckling of the piezoelectric beam. This transition results in oscillations of the piezoelectric beam and causes power generation. After the force is removed (the person takes another step or the car passes over) the beam springs back to the unbuckled shape and more power is generated. To prevent the beam from fracture or damage, a mechanical stop is placed to limit the beam's deformation. The vertical design can be implemented in roads, using the weight of the passing cars to generate electricity. By using the segmented beam instead of a uniform beam the gap distance increases, which makes this design more practical in terms of manufacturing. The other configuration of the device (horizontal) makes it easy to implement in treadmills, shopping centers floors, or dance floors and also makes it possible to use the human body weight as the source of applying force to the device and generating electricity. The gap distance is also larger for this new configuration. It was shown that this distance is increased around 500 times in comparison to vertical configuration using a uniform beam. Gap distances for different theta angles and different lateral beams were discussed and it was shown that theta angle is a critical parameter in designing the horizontal device. Governing equations of the system were derived for two cases (before engagement of the stop and after it). The transient vibrations of the beam have been analytically modeled. The geometric nonlinearities of the beam have been taken into account. The deflection and output power of the device were calculated and studied for two case studies. It was shown that there is an optimized resistance for each design that generates the maximum average power output. Finally, the effect of the length and thickness of the piezoelectric layers on the output power and also the gap distance were investigated.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An energy harvesting system for harvesting energy in response to application of an external force, said energy harvesting system comprising:

a first beam member having a central member and at least one piezoelectric layer joined to the central member for deflection therewith, said first beam member having opposing first and second ends, said first beam member being elastically deformable in response to application of the external force;

a first mount coupling said first end of said first beam member, said first mount being generally stationary, the first mount comprises a lower beam;

a second mount coupling said second end of said first beam member, said second mount and said second end of said first beam member being generally moveable in response to application of the external force between a first position and a second position, thereby outputting energy from said at least one piezoelectric layer in response to said movement from said first position to said second position, the second mount comprises an upper beam;

a stop member physically opposing movement of said second mount and said second end of said first beam member in said second position; and a plurality of oblique beams, a first pair of the plurality of oblique beams interconnecting the first mount to the first beam member and a second pair of the plurality of oblique beams interconnecting the second mount to the first beam member, the plurality of oblique beams transmitting a compressive bending force to the first beam member in response to the external force.

2. The energy harvesting system according to claim 1 wherein the stop member comprises a block member disposed between the lower beam and the upper beam to oppose the external force once the upper beam is spaced a predetermined distance from the lower beam.

3. An energy harvesting system for harvesting energy in response to application of an external force, said energy harvesting system comprising:
   an upper beam member;
   a lower beam member being moveable relative to the upper beam member in response to application of the external force;
   a middle beam member having a central member and at least one piezoelectric layer joined to the central member for deflection therewith, said middle beam member having opposing first and second ends, said middle beam member being elastically deformable in response to application of the external force;
   a first pair of oblique beams interconnecting the upper beam member to the first and second ends of the middle beam member;
   a second pair of oblique beams interconnecting the lower beam member to the first and second ends of the middle beam member;
   wherein application of the external force causes application of a compressive force on the middle beam member thereby outputting electrical energy from the at least one piezoelectric layer.

4. The energy harvesting system according to claim 3, further comprising:
   a stop member physically opposing movement of said upper beam member relative to said lower beam member beyond a predetermined distance.

5. The energy harvesting system according to claim 3 wherein said middle beam member comprises two piezoelectric layers disposed on opposing sides of said central member.

6. The energy harvesting system according to claim 3 wherein said middle beam member comprises a pair of central members each having at least one piezoelectric layers joined thereto.

7. The energy harvesting system according to claim 3 wherein the at least one piezoelectric layer comprises at least two piezoelectric layers, each of the at least two piezoelectric layers being joined to opposing sides of the central member.

8. The energy harvesting system according to claim 3 wherein the at least one piezoelectric layer is joined to only a portion of a length of the central member.

9. The energy harvesting system according to claim 8 wherein the at least one piezoelectric layer is joined to a central portion of the length of the central member.

* * * * *